US006177218B1

(12) United States Patent
Felker et al.

(10) Patent No.: US 6,177,218 B1
(45) Date of Patent: Jan. 23, 2001

(54) LITHOGRAPHIC PROCESS FOR DEVICE FABRICATION USING ELECTRON BEAM IMAGING

(75) Inventors: Joseph Allen Felker, Belle Mead; James Alexander Liddle, Westfield; Stuart Thomas Stanton, Bridgewater, all of NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/270,487

(22) Filed: Mar. 15, 1999

Related U.S. Application Data

(60) Provisional application No. 60/095,688, filed on Aug. 7, 1998.

(51) Int. Cl.[7] .............................. G03F 9/00; G03C 5/00

(52) U.S. Cl. .............................. 430/30; 430/296; 430/942

(58) Field of Search .............................. 430/30, 296, 942

(56) References Cited

U.S. PATENT DOCUMENTS

| | | | |
|---|---|---|---|
| 4,390,788 | 6/1983 | Hayashi et al. | 250/491 |
| 4,708,466 | 11/1987 | Isohata et al. | 355/63 |
| 4,812,661 | 3/1989 | Owen | 250/491.1 |
| 4,818,885 | 4/1989 | Davis et al. | 250/492.2 |
| 4,924,257 | 5/1990 | Jain | 355/53 |
| 5,079,112 | 1/1992 | Berger et al. | 430/4 |
| 5,130,213 | 7/1992 | Berger et al. | 430/4 |
| 5,175,075 | 12/1992 | Frazier et al. | 430/296 |
| 5,227,269 | 7/1993 | Scott | 430/5 |
| 5,227,839 | 7/1993 | Allen | 355/53 |
| 5,260,151 | 11/1993 | Berger et al. | 430/5 |
| 5,279,925 | 1/1994 | Berger et al. | 430/246 |
| 5,301,124 | 4/1994 | Chan et al. | 364/490 |
| 5,316,879 | 5/1994 | Berger et al. | 430/5 |
| 5,347,592 | 9/1994 | Yasuda et al. | 328/8 |
| 5,376,505 | 12/1994 | Berger et al. | 430/296 |
| 5,437,946 | 8/1995 | McCoy | 430/5 |
| 5,523,580 | 6/1996 | Davis | 250/505.1 |

OTHER PUBLICATIONS

Liddle et al., J. Vac. Sci. Technol. B., "Error Budget Analysis of the SCALPEL® Mask For Sub–0.2 μm Lithography", vol. 13(6), pp. 2483–2487, Nov./Dec.

Alexander et al., J. Vac. Sci. Technol. B, "Stress Induced Pattern–Placement Errors In Thin Membrane Masks", vol. 12(6), pp. 3528–3532, Nov./Dec. 1994.

Stanton et al., *Journal of Vacuum Science & Technology, B*, "Critical Dimension Control at Stitched Subfield Boundaries in a High–Throughput SCALPEL® System", vol. 16, No. 6, pp. 3197–3201, Nov./Dec. 1998.

*Primary Examiner*—Christopher G. Young
(74) *Attorney, Agent, or Firm*—Richard J. Botos

(57) ABSTRACT

A lithographic process for device fabrication in which a pattern is transferred from a mask into an energy sensitive material by projecting charged particle (e.g. electron beam) radiation onto the mask is disclosed. The pattern on the mask is divided into segments. The radiation transmitted through the mask and incident on the layer of energy sensitive material transfers a continuous image of the segmented mask pattern into the energy sensitive material. The images of each segment are joined together to form the continuous image by seam blending techniques. The seam blending techniques employ duplicate pattern information on segments for which the images are joined together. The image of the duplicate pattern information from a first segment is overlapped with the image of the duplicate pattern information from the second segment to blend the seams together. The exposure of the duplicate pattern information is controlled so that the aggregate dose of radiation used to transfer the image of the duplicate pattern information into the energy sensitive resist is about the same as the does of radiation used to transfer the image of the non-duplicate pattern information into the energy sensitive resist material.

11 Claims, 4 Drawing Sheets

LITHOGRAPHIC PROCESS FOR DEVICE FABRICATION USING ELECTRON BEAM IMAGING

CROSS-REFERENCE TO RELATED APPLICATION

This application claims priority of Provisional Application Ser. No. 60/095,688 which was filed Aug. 7, 1998.

BACKGROUND OF THE INVENTION

1. Technical Field

The present invention is directed to a lithographic process for device fabrication in which charged particle energy is used to delineate a pattern in an energy sensitive material. The pattern is delineated by projecting the charged particle energy onto a patterned mask, thereby projecting an image of the mask onto the energy sensitive material.

2. Art Background

In device processing, an energy sensitive material, denominated a resist, is coated on a substrate such as a semiconductor wafer (e.g., a silicon wafer), a ferroelectric wafer, an insulating wafer, (e.g. a sapphire wafer), a chromium layer supported by a substrate, or a substrate having a combination of such materials. An image of a pattern is introduced into the resist by subjecting the resist to patterned radiation. The image is then developed to produce a patterned resist using expedients such as a solution-based developer or a plasma etch to remove one of either the exposed portion or the unexposed portion of the resist. The developed pattern is then used in subsequent processing (e.g. as a mask to process (e.g. etch) the underlying layer). The resist is then removed. For many devices, subsequent layers are formed and the process is repeated to form overlying patterns in the device.

In recent years, lithographic processes in which a charged particle beam is used to delineate a pattern in an energy sensitive resist material have been developed. Such processes provide high resolution and high throughput. One such process is the SCALPEL® (scattering with angular limitation projection electron beam lithography) process. The SCALPEL® process is described in U.S. Pat. No. 5,260,151 which is hereby incorporated by reference.

Referring to FIG. 1, in the SCALPEL® process, a mask 10 is used to pattern particle beams 11 and 12. The entire mask 10 is not illuminated at once. Rather, the mask 10 is illuminated in segments (two adjacent segments 25 and 26 are illustrated in FIG. 1). Accordingly, segment 25 is first illuminated by means of particle beam 11 and subsequently segment 26 is illuminated by particle beam 12. Mask 10, as shown, consists of a membrane 13, which is transparent to the particle beams incident thereon.

The developed image of the mask pattern is defined by blocking regions 14, which scatter the particle beams incident thereon. The blocking regions block the particles incident thereon from being transmitted onto the resist-coated wafer 24. In the illustrated example, the mask 10 also has skirt regions 15 on the periphery of the segments 25 and 26. Supporting struts 16 are spaced to define a mask segment 25 and 26. Emerging beams 11*a* and 12*a* are that portion of the radiation incident on the mask that is significantly scattered by either the blocking regions 14 or skirt regions 15. Skirt regions 15 are provided because it is preferable for the incident beam to fit entirely within the area defined by the segment and not to contact the support struts. Since the diameter of the beam incident on the mask segment may extend beyond the patterned region of the mask segment in at least one dimension, the skirt regions are provided so that the distance between the struts 16 is greater than the diameter of the beam.

Unblocked illumination, consisting, in sequence, primarily of beams 11*a* and 12*a* is caused to converge by means of electromagnetic/electrostatic first projector lens system 17, thereby producing emerging beams 11*b* and 12*b* to result in cross-over, e.g. of beams 11*c* and 12*c* at position 18, as depicted on the plane of apertured scatter filter 19. Filter 19 is on the back focal plane for the instance in which beams 11*a* and 11*b* are parallel to the optical axis.

Second projector lens system 22 is of such configuration and so powered as to bring the beams of each of the bundles (11*c* and 12*c*) into an approximately parallel relationship. The action of the lens 22 is sufficient to direct the on-axis bundle 11*d* into orthogonal incidence onto wafer 24. For the off-axis bundle 12*c*, redirection is required in order to avoid imaging the struts 14 and skirts 15 that separate mask segments 25 and 26. Such redirection is performed by deflectors 20 and 21. Deflectors 20 are so energized as to redirect off-axis beams such as beams 12*c* to result in positioned beams 12*d*. The function of the deflectors 21 is to bring about final directional control so as to result in beams 12*e* and so as to eliminate images of associated struts and skirts.

Various strategies for blending the images projected from discrete areas of a patterned mask in order to provide a seamless image in the energy sensitive material have been suggested. One such strategy is described in U.S. Pat. No. 5,624,774 to Okino et al. In Okino et al., the mask contains patterned regions separated by border region. The image of a first pattern is transferred into the energy sensitive material. The image of a second pattern is then transferred into the energy sensitive material. Pattern 1 and pattern 2 are separated by a border on the mask. However, the image of the border is not to be transferred into the energy sensitive material, that is, the image of pattern 1 and the image of pattern 2 are to be seamlessly joined (stitched) in the energy sensitive material. In order to accomplish this, Okino et al. have a third pattern on the mask which is an image of the desired seam between patterns one and two (i.e. pattern 3 has a certain portion of the side of pattern 1 adjacent to pattern 2 and comparable portion of pattern two from the side adjacent to pattern 1. Thus Okino et al. have a separate pattern of the desired seam between all of the main patterns on the mask.

As previously noted, the mask used in SCALPEL® has a plurality of patterned areas separated by struts. In the SCALPEL® process, it is desired to produce a seamless image of the patterned areas on the mask. If the images of the patterned areas are not precisely joined, then the device that is ultimately fabricated may be defective (e.g., if the pattern is a conductive path and the portions of the image are not properly aligned, conductivity can be reduced or destroyed, rendering the device unuseable). Accordingly, an efficient and accurate process for producing a seamless image from a plurality of discrete patterned portions on a strutted mask is desired.

SUMMARY OF THE INVENTION

The present invention is directed to a lithographic process for device fabrication in which a pattern is transferred from a mask into an energy sensitive material by projecting charged particle (e.g. electron beam) radiation onto the mask. The radiation transmitted through the mask and incident on the layer of energy sensitive material transfers an image of the pattern into the energy sensitive material.

An example of a SCALPEL® mask is illustrated in FIG. 2. The mask 100 has a thin (about 100 nm-thick) membrane 105 made of a low atomic number material; a thin (about 20 nm thick) patterned layer 110 made of a high atomic number material; a supporting grillage 115 and a mounting ring 120. SCALPEL® masks are described in Liddle, J., et al., "Error budget analysis of the SCALPEL® mask for sub-0.2 $\mu$m lithography," *J. Vac. Sci. Technol.* B 13(6), pp. 2483–2487 (1995), which is hereby incorporated by reference.

The mask 100 contains a plurality of patterned areas 125. Referring to FIG. 3, a continuous image 200 (FIG. 3C) is formed from segmented pattern 205 (FIG. 3A). The continuous image 200 is formed in a layer of energy sensitive resist material formed on a semiconductor substrate. The image depicted in the figures is not representative of an actual pattern used in device fabrication, but is provided to illustrate the general concept of assembling an image from discrete pattern segments on the mask. A discussion of assembling an image using a mask with a segmented pattern in described in Berger, S. D., et al., "High throughput projection electron-beam lithography employing SCALPEL," *SPIE,* vol. 2016, p. 66 (1993), which is hereby incorporated by reference.

The segmented pattern 205 is formed to accommodate struts 210 and 211 (shown as dashed lines). The pattern is segmented into portions 215, 216, 217, and 218. Referring to FIG. 3B, pattern segments 215, 216, 217 and 218 are included in respective mask segments 225, 226, 227, and 228. The mask segments are separated by struts 210 and 211. Struts 210 and 211 have skirts 212 and 213 adjacent thereto.

Since the process of the present invention requires the discrete imaging of mask segments in order to produce a continuous image, the process requires the relative movement of the mask and the wafer with respect to the field of the imaging radiation and the exposure field on the wafer. In electron beam lithography, the field of the imaging radiation is moved by deflecting the beam. However, the area of the mask that can be imaged by deflecting the beam is still less than the entire area of the mask. Therefore, in order to assemble the continuous image in the energy sensitive resist on the wafer, the movement of the mask, wafer, and radiation incident on the mask must be coordinated. The coordination of wafer movement, mask movement, and the deflection of incident radiation is described in U.S. Pat. No. 5,376,505 to Berger et al., which is incorporated by reference herein.

The present invention provides certain refinements in order to effect more efficient imaging and to stitch together the images of the segmented pattern from the mask to form the desired continuous image. In one embodiment of the present invention, the area of a mask segment is adapted for more efficient imaging. For membrane masks, it is critical that the patterning of the scattering/absorbing layer, which is typically somewhat stressed, not produce distortion in the pattern. A distorted pattern creates a distorted image, which is clearly undesirable.

The grillage structure of the mask is intended to keep the membrane from distorting when the pattern is created thereon. It is known to one skilled in the art that there is a maximum area of the membrane that can be unsupported before the pattern-induced stress in the membrane causes unacceptable pattern distortion. One skilled in the art will appreciate that the maximum area that can be unsupported depends upon the mask material, the mask dimensions, and the resulting stresses.

The grillage is a first series of parallel struts and a second series of parallel struts wherein the first series is orthogonal to the second series (i.e. cross struts). In the present invention, the distance between the struts is not equal to the distance between the cross struts. Each pattern segment is contained in an unsupported area of the membrane that is bordered by struts. The unsupported area does not exceed the limitation on the area imposed by the need to avoid stress-induced distortions in the pattern. However, the unsupported area is tailored to permit efficient imaging of the mask. In the present invention, the unsupported areas that contain mask segments are rectangular (i.e. the distance between the cross-struts is greater than the distance between the struts). In the present invention, the cross-struts are in a direction that is orthogonal to the deflector scan and the struts are parallel to the direction of the deflector scan. The deflector scan, as used herein, is the scan of the beam as it illuminates a mask segment.

Unsupported mask segments with this configuration are advantageous because one does not wish to transfer the image of the strut and skirt areas of the mask into the energy sensitive material. Therefore, the beam of illuminating radiation is required to skip over the strut and skirt areas. The fewer times that the beam has to skip when creating an image from a segmented mask, the more efficient the process.

In another embodiment of the present invention, the width of the pattern in a given mask segment is tailored to correspond to the diameter of the beam of illuminating radiation. As the beam is deflected along the pattern segment, an image of the segment is transferred into the energy sensitive material. In order to assemble a continuous pattern from these segments, a portion of the image of one segment (segment n) is overlapped with a portion of the adjacent image of a second segment (segment n+1). The overlapping image blends the edges of the two adjacent images together.

The desired blending of image segments is effected by edge regions (of the mask segments) that are patterned to duplicate the pattern of the edge regions of adjacent image segments. For example, for adjacent image segments n and n+1, their respective mask segments, n' and n'+1, have duplicate patterns at the edge of the pattern that will be used to create the seam between image segments n and n+1. When scanning the mask segment with the illuminating radiation, the dose of radiation used to illuminate the pattern that is duplicated in an adjacent segment is adjusted to reflect the fact that this pattern will be imaged twice.

Techniques for controlling the dose of radiation when blending the edges of two image segments are described in U.S. Pat. No. 5,437,946 to McCoy, which is incorporated by reference herein. In one embodiment of the present invention, a shaped aperture is used to control the dose profile of radiation (the profile is in the direction perpendicular to the scan) incident on the duplicate pattern information. In each scan of the duplicate pattern information, the duplicate pattern receives a mean dose of incident radiation. Consequently, the scan of the duplicate pattern information with the shaped aperture creates a different dose profile for the duplicate pattern information than for the non-duplicate pattern information. The image of the duplicate pattern information is created by two scans of duplicate pattern information. The dose profile of the first scan is the compliment of the dose profile of the second, so that the aggregate dose used to create the image of the duplicate pattern information is the same as the dose used to create the image of the non-duplicate pattern information. The complementary dose profiles are obtained by tailoring the dose with the shaped aperture so that the dose received in the mid-point of the duplicate pattern information (in the direction perpendicular to the scan) is one-half the total dose received by the non-duplicate pattern information in the same scan.

In the process of the present invention, the patterned mask segment is approximately the same as the scanning distance for the beam of illuminating radiation. However, the edge portions of the patterned mask segments contain pattern information that is redundant. As used herein, redundant pattern information is pattern information that is contained in more than one mask segment in order to facilitate blending the images produced using the two segments. The image that is created from the mask segment (from either redundant or non-redundant pattern information in the segment) receives a uniform dose of radiation. Since the image is created in a dynamic environment, (i.e. wafer, mask and beam moving relative to each other), each point of the illuminated radiation receives a dose radiation over a time t, and not instantaneously. The time t is the time it takes for the beam to pass over the point.

The patterned mask segment is scanned from its first end to its second end. If the ends contain duplicate pattern information to effect blending the ends (in terms of the direction of the scan the end is where the scan of a first mask segment ends and the scan of a second mask segment begins) of adjacent image segments, the image created from this duplicate information would receive twice the dose of radiation received by the rest of the image. A shaped aperture is not useful to limit the dose profile at the ends of the scan because the need for this dose control is only at the beginning and end of the scan, not continuously throughout the scan.

In this embodiment, the beam is turned on after the scan is started and turned off before the scan is completed. Specifically, the beam of illuminating radiation has a diameter d. As the beam is scanned, the beam has a leading edge and a trailing edge a distance d behind the leading edge. As the scan is commenced, the beam is not turned on until the trailing edge of the beam is at the edge of the patterned mask segment. Similarly, as the scan is completed, the beam is turned off when the leading edge of the beam is at the other edge of the patterned mask segment. This is referred to as beam blanking.

The pattern at the beginning edge and ending edge (beginning and ending being relative to the scan) contains duplicate pattern information to blend the image (n) from the mask segment with the image created from the previous scan (n−1) and the next scan (n+1). By blanking the beam in the above-describe manner, the image created from the duplicate information (i.e. the seam blended pattern) receives a portion of its total dose from one scan (n) and the other portion of its total dose from the other scan (either n−1 or n+1).

In yet another embodiment of the present invention, the mask segment is scanned a plurality of times instead of just once. The objective of the multiple scans is to control the temperature profile in either the energy sensitive resist, the wafer or the mask that is created by the beam of incident radiation. For example, as the image is introduced into the energy sensitive resist material by the beam of incident radiation, so is heat. The faster the heat is introduced into the resist, the less time it has to dissipate from the resist. As heat accumulates in the resist, its temperature also increases. As a result, a non-uniform temperature profile is introduced into the resist which can lead to pattern distortion. By scanning the mask segment a plurality of times to deliver the desired dose, instead of scanning the mask segment once to obtain the desired dose, the heat is introduced into the mask by the beam of exposing radiation per unit dose at a reduced rate. As a result of this reduced rate of heat introduction, a more uniform temperature profile in the energy sensitive resist is obtained as the image is introduced therein.

DETAILED DESCRIPTION

Figure 1:
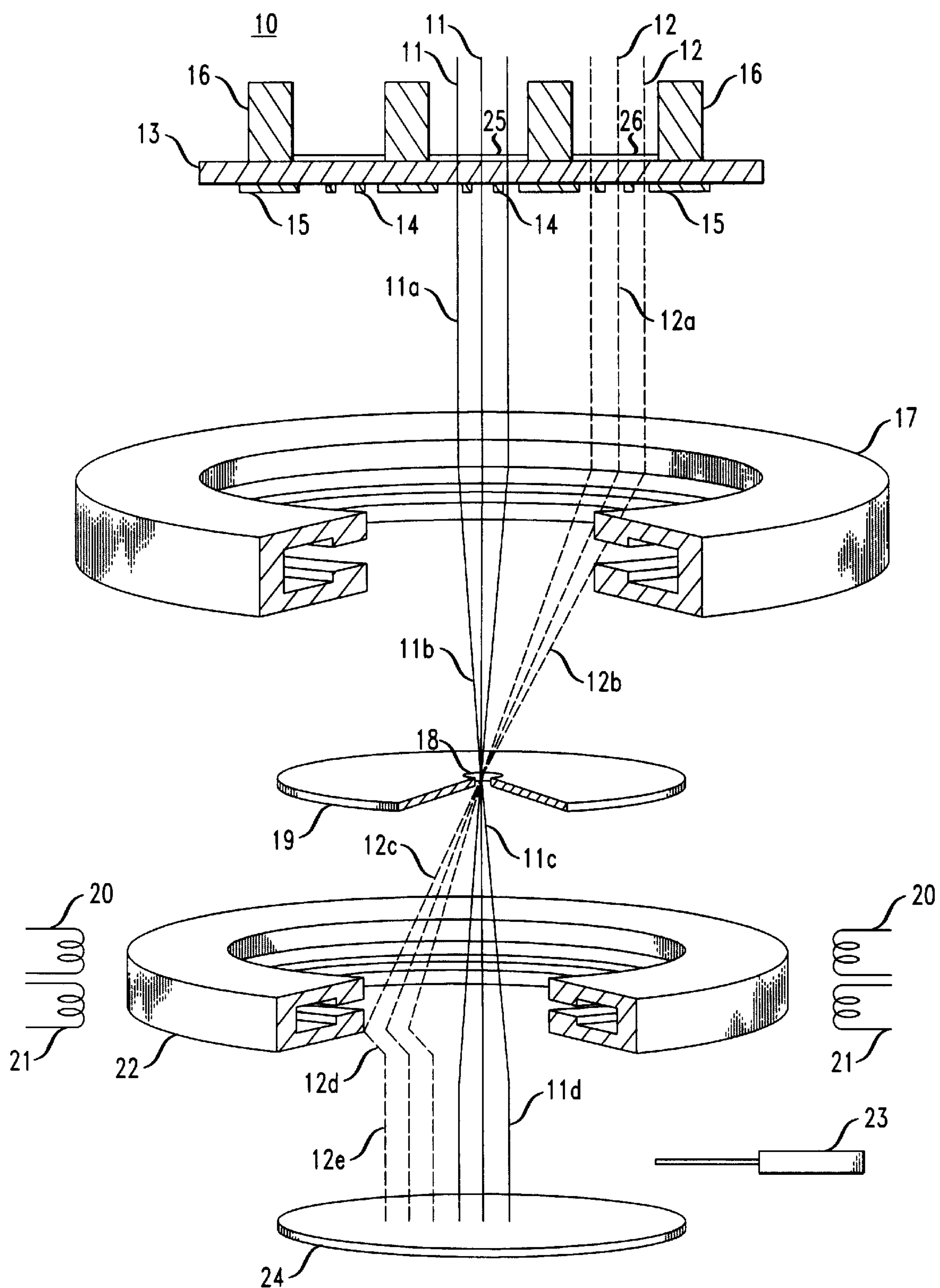
FIG. 1 is a schematic perspective view of a projection lithography apparatus that uses a charged particle beam and a segmented mask to delineate and image of a pattern in an energy sensitive material.
Figure 2:
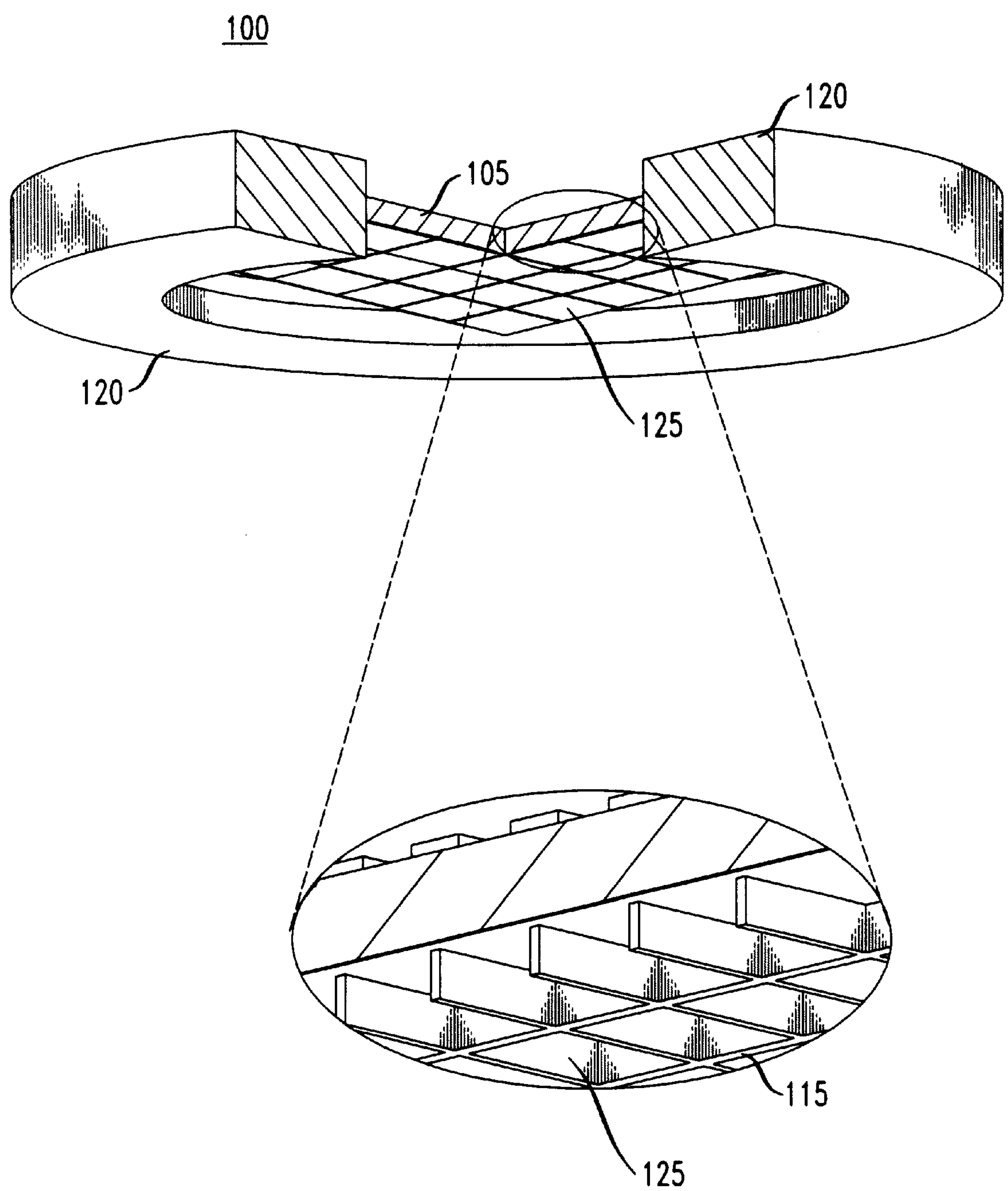
FIG. 2 illustrates a segmented mask that is used in the process of the present invention which includes FIG. 2A depicting the mask and FIG. 2B which shows a magnified section, both in perspective.
Figure 3:
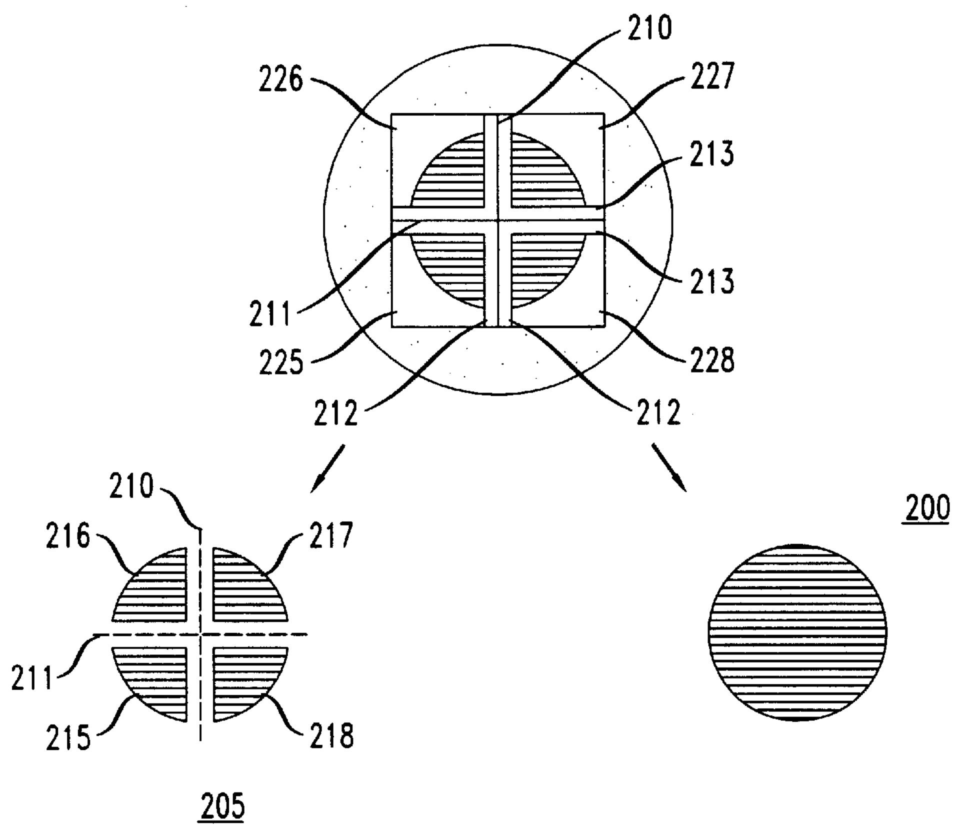
FIG. 3 consists of FIG. 3A, which depicts a segmented pattern, FIG. 3B which depicts a segmented pattern on a mask, and FIG. 3C, which depicts a continuous pattern formed from the segmented mask.

The present invention is directed to a lithographic process for device fabrication. In the lithographic process, electron beam radiation is projected onto a patterned mask. The pattern defined by the mask is divided into a plurality of mask segments. The electron beam radiation that passes through the mask delineates an image of the mask pattern into a layer of energy sensitive material (i.e., a resist) formed on a substrate (typically a semiconductor substrate such as a silicon wafer). In the process of the present invention, the segmented mask pattern is used to delineate an unsegmented, continuous image of the segmented pattern in the energy sensitive resist material.

In the process of the present invention, the mask pattern segment is scanned by the electron beam. The mask pattern segments are configured so that the segment is equal to or smaller than the diameter of the beam in the direction orthogonal to the scan and larger than the diameter of the beam in the direction of the scan. For convenience, the segment will be described as a rectangle, although other segment configurations are not precluded. Also for convenience, the smaller dimension of the segment (the dimension smaller than the diameter of the electron beam) will be referred to as the segment width and the larger dimension of the segment will be segment length. The area of the segment cannot exceed the support requirements for the mask membrane, as previously noted. Within those constraints, the area of the mask segments is largely a matter of design choice. It is however, advantageous to make each mask segment as large as possible to control the number of stitching events that are required to assemble the desired image from the mask segments.

The invention is described in terms of an optical field and an effective optical field. The optical field is the imaging beam cross-section that has the requisite optical characteristics (e.g. beam uniformity, image resolution, etc. over the optical field) to meet the lithographic requirements of the process. The effective optical field is created by rapidly scanning the beam above the mask. The desired image quality is maintained by dynamically adjusting or correcting the optics between the mask and the substrate. The region over which these corrections are effective defines the extent of the effective optical field. The beam scan is sufficiently fast, compared to the mechanical motions of the respective mask and substrate stages, to create the appearance of a large field over a scan range which permits the creation of an image of the scanned pattern. For example, the effective field size is the extent of a well-corrected fast deflection pattern of the basic 0.25 mm sub-field, mainly orthogonal to the stage scan direction. The large field size is employed so that the image is introduced more quickly than writing strategies that employ smaller fields.

The following are examples of exemplary operating conditions for the process of the present invention. Effective optical field size will probably be about 3 mm, but not less than 2 mm. The effective optical field size is as large as 5 mm. Resist process dose requirement is about 10 $\mu C/cm^2$ to about 5 $\mu C/cm^2$. A probable space-charge limited current (at the substrate level) is about 30 $\mu A$ to about 40 $\mu A$.

In the process of present invention, the movement of the beam of incident radiation, the mask and the wafer are coordinated to obtain a continuous image from segmented patterns in the mask. Since neither mask segment area dimension is as large as a full image assembled from the segmented pattern (i.e the semiconductor chip area is the imaged area) is expected to be, stitching is in two directions. A certain number of stitching events (discrete, non-scanned connection of image parts with a potentially discernible seam) are required by the breakup of the mask into segments. For simplicity, the present invention will be described in terms of the frame of reference of the beam intersecting the segment. One skilled in the art will appreciate that this is a dynamic frame of reference, since the stage on which the mask is placed is also moving during the scan. Consequently, in order for the beam to scan the segment in the manner described herein, the beam must also be deflected during the scan to adjust for movement of the mask stage. Beam deflection to adjust for mask stage motion is well known to one skilled in the art, and will not be described in detail herein. In the present invention, it is advantageous if the mask stage moves in a direction that is orthogonal to the direction of the scan. One skilled in the art will appreciate that there are a number of different writing strategies (i.e. the strategies for introducing the mask image into the energy sensitive material) in which the scan is orthogonal to the mask stage motion and the mask stage moves during the scan.

Since the pattern is continuous within a segment, stitching of the pattern within a given segment is not required. The number of stitching events is determined by the number of segments that are needed to form the desired pattern. The required number of segments is determined by the chip area.

Figure 4:
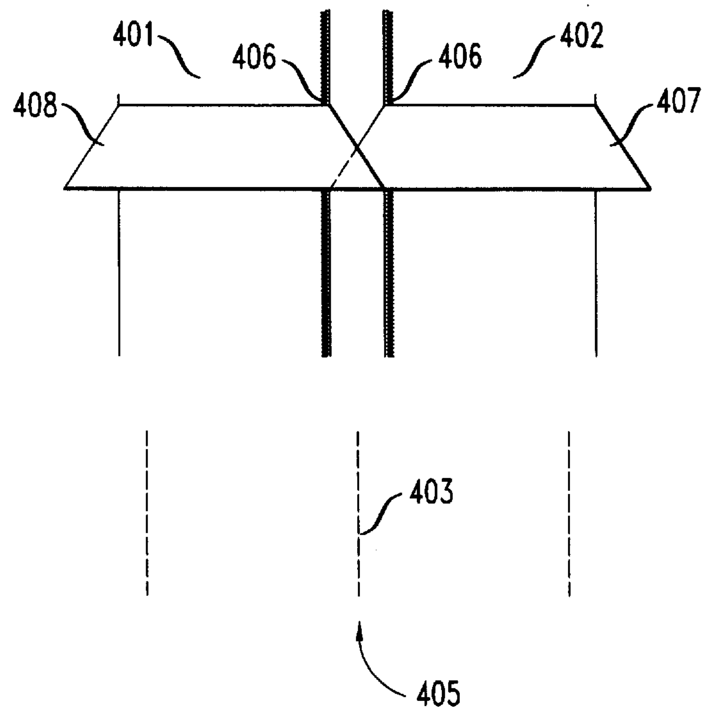
FIG. 4 is a schematic depiction of blending the seam of an image formed from scanning two segments, wherein the seam is in the direction of the scan.

In the present invention, segments are stitched together both lengthwise and end to end. In the lengthwise direction, segments are stitched together by a technique referred to as seam blending. Seam blending schemes alleviate critical dimension (CD) sensitivity to stitching errors on the mask segment image boundaries. In seam blending, a small edge-portion (blending region) of the mask pattern segment appears redundantly in both segment n and n+1 in such a way that they are overlapped in the course of stitching. They are also given complementary doses from tapered profiles spanning the redundant area. This is illustrated with reference to FIG. 4 FIG. 4 schematically illustrates two segments 401 and 402. These segments are scanned individually to produce contiguous pattern 405. Image 405 results from placing the image of 401 adjacent to the image of 402. The seam 403 between the images 401 and 402 is blended by providing redundant pattern information in portion 406 of each segment 401 and 402. This redundant pattern information 406 is part of the image that results from the scan of segments 401 and 402. In order to ensure that the redundant pattern information does not receive a greater dose of radiation than the other pattern information in the segment, the per scan dose of radiation incident on the redundant pattern information per scan is reduced by one-half on average. This is illustrated pictorially in FIG. 4, by the trapezoidal shapes 407 and 408. Shapes 407 and 408 illustrate the dose profile across the segments 401 and 402. Specifically, the tapered portions of the trapezoidal shapes 407 and 408 overlie the redundant pattern information and illustrate that a tapered dose profile is provided over the redundant pattern information. A dose profile is dose as a function of position. The tapered does profile ensures that the aggregate dose profile (i.e. the dose profile for the first scan combined with the dose profile from the second scan) is about the same as the dose profile over the non-redundant portion of the segment. Various alternative complementary dose-profile shapes are possible.

Figure 5:
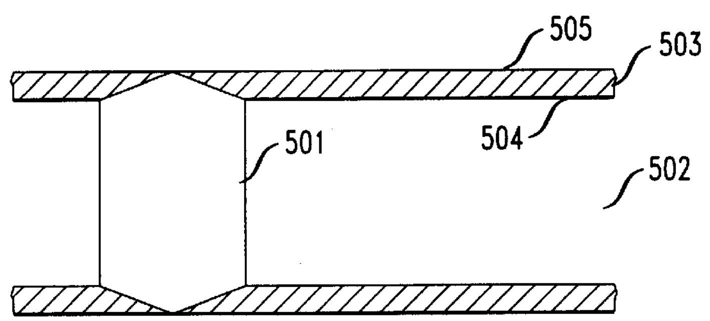
FIG. 5 is a schematic illustration of how a shaped aperture is used to blend the seams of adjacent images of two different mask segments.

One mechanism for controlling the dose profile is illustrated in FIG. 5. FIG. 5 illustrates a hexagonal aperture 501 that is used to control the dose profile. The accumulated dose is larger or smaller depending on the width of the aperture. The wider the aperture, the larger the dose. Thus the dose begins to decrease at the point where the aperture 501 begins to taper and goes to zero as the taper comes to a point.

The tapered portion of the aperture 501 scans over the portion of the segment 502 that contains redundant pattern information 503. Thus the dose profile tapers down from a maximum at the inner edge 504 of the redundant pattern information 503 to zero at the outer edge 505.

The image of the redundant pattern is created from two scans. The first scan is of the redundant pattern information in one segment, and the second scan is of a copy of the same redundant pattern information in a second scan. The dose profile of the first scan is the mirror image of the dose profile for the second scan (e.g., the edge of the redundant pattern information that receives maximum dose in the first scan receives minimum dose in the second scan). The aggregate dose profile is thus uniform, and at the desired process dose. Process dose is the dose required to print features of the correct size.

A steep dose profile over the scan of the redundant pattern information is advantageous because, the steeper the profile, the narrower the width of the redundant pattern information. Since redundant pattern information takes up mask real estate that would otherwise be used for pattern information, it is advantageous to keep the area of redundant pattern information small in order to preserve the mask real estate for non-redundant pattern information. However, the blend region should be substantially larger than the blur associated with the imaging process. Blur results from optical aberrations, space charge effects, resist effect, etc. Also, dose error allocation of 1% requires taper placement to 1% of its width. For example, if the blend region (i.e. the region of redundant pattern information) is 5 to 10% of the segment (sub-field) width, perhaps not more than 2.5 microns wide in wafer scale, then taper placement to 0.025 microns wafer scale or less is required.

Figure 6:
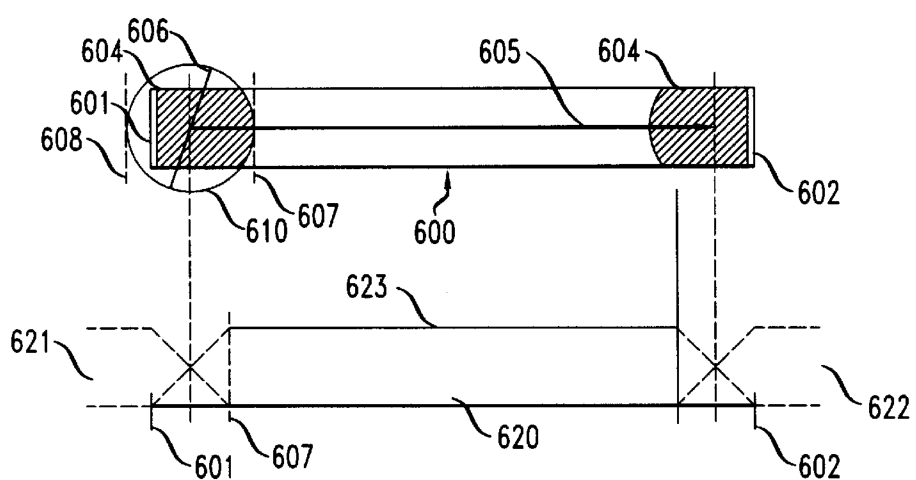
FIG. 6 is a schematic illustration of the use of beam blanking to blend the end of the image of one mask segment with the end of an adjacent image of a second mask segment.

Referring to FIG. 6, patterned mask segment 600 is scanned from its first end 601 to its second end 602. The ends contain duplicate pattern information 604 to effect blending the ends (in terms of the direction of the scan 605 the end is where the scan of a first mask segment ends at 602 and the scan of a second mask segment (not shown) begins) of adjacent image segments. The image created from this duplicate information will receive twice the dose of radiation received by the rest of the image if the beam overscans the segment. For purposes of the present invention, overscan is when the beam is on when its leading edge 607 passes over the first end 601 of the segment and remains on until its trailing edge 608 passes over the second end 602 of the segment. A shaped aperture is not useful to limit the dose profile at the ends of the scan because the need for this dose control is only at the beginning and end of the scan, not continuously throughout the scan.

In this embodiment, the beam is turned on after the scan is started and turned off before the scan is completed. Specifically, the beam of illuminating radiation has a diameter 606. As the beam is scanned, the beam 610 has a leading edge 607 and a trailing edge 608 a distance 606 behind the leading edge. In this embodiment, the beam cross-section is equal to the size of the optical field 610. The effective field is greater than or equal to the area of segment 600. As the scan is commenced, the beam 610 is not turned on until the trailing edge 608 of the beam is at the edge 601 of the patterned mask segment 600. Similarly, as the scan is completed, the beam is turned off when the leading edge 607 of the beam is at the other edge 602 of the patterned mask segment 600. This is referred to as beam blanking.

The pattern at the beginning edge and ending edge (beginning and ending being relative to the scan) contains duplicate pattern information to blend the image (n) from the mask segment 600 with the image created from the previous scan (n−1) (not shown) and the next scan (n+1) (not shown). By blanking the beam in the above-describe manner, the image created from the duplicate information (i.e. the seam blended pattern) receives a portion of its total dose from one scan (n) and the complementary portion of its total dose from the other scan (either n−1 or n+1).

The resulting dose profile 620 from the scan of segment 600 illustrates that the profile over the redundant pattern information 604 is tapered. At the beginning edge 601 of the scan the dose is zero and does not reach maximum until trailing edge 608 reaches the position of the leading edge 607 when the beam was blanked on. The dose profile 621 for the second end of the n−1 segment illustrates an opposite dose profile over the scan of redundant pattern information 604 on the first end of segment 600. The dose profile 622 for the first end of the n+1 segment illustrates an opposite dose profile over the scan of redundant pattern information 604 on the second end of the segment 600. The aggregate dose profile (the total dose at each point on the x axis for the two scans of the redundant pattern information) is the same as the dose 623 received by the other portions of the segment 600.

The sloped portion of the dose profile has a length of one sub-field 611 along the x-axis. The net scan motion is one optical field less than the length of the segment. For a 3 mm wafer-scale segment (3 mm effective field optics), the amount of area redundantly exposed is one optical field per segment, or 8.3 percent. This is equivalent to dropping the effective field from 3 to 2.75 mm, and has inconsequential throughput consequences.

For side seam blending, the region of the segment that receives the tapered dose profile is about one percent of the segment width. In order to achieve a one-percent dose accuracy within the blending region, the tapered dose profile must also be placed within one percent accuracy with respect to its complementary dose profile. In the case of blending along the segment ends, the placement requirement for the optical field becomes a timing requirement. The beam must be turned on or off within one percent of the time it takes the beam to pass over a given point.

In yet another embodiment of the present invention, the mask segment is scanned a plurality of times instead of just once. The objective of the multiple scans is to control the temperature profile in the wafer that is created by the beam of incident radiation. As the image is introduced into the energy sensitive resist material by the beam of incident radiation, so is heat. The faster the heat is introduced into the resist and underlying substrate, the less time it has to dissipate. Consequently, heat accumulates in the resist and underlying substrate. As a result, a non-uniform temperature profile is introduced into the resist and substrate which can lead to pattern distortion. By scanning the mask segment a plurality of times to deliver the desired dose, instead of scanning the mask segment once to obtain the desired dose, the heat is introduced into a local area of the mask, the resist and the underlying substrate by the beam of exposing radiation per unit dose at a reduced rate. The rate of exposure of the entire effective field is about the same as for a single pass. As a result of this reduced rate of heat introduction, a more uniform temperature profile in the mask, resist and/or underlying substrate is obtained as the image is introduced.

In one example, scan trajectory is modified to make several (4 to 10) mini-scan passes of the mask segment before a strut-hop to the next segment. The improved smoothness, symmetry, and peak level of the observed temperature distribution in an energy sensitive material and substrate with reference to FIG. 7 is shown.

Figure 7A:
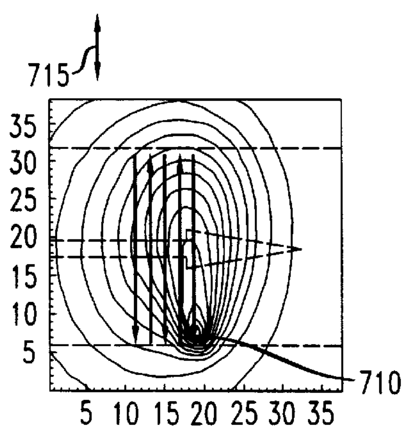
FIG. 7 illustrates the effect of a multiple-cycle exposure scan on the temperature profile of the energy sensitive resist material.
Figure 7B:
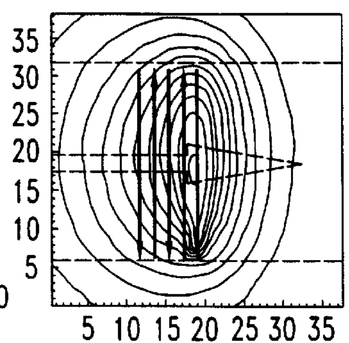
Figure 7C:
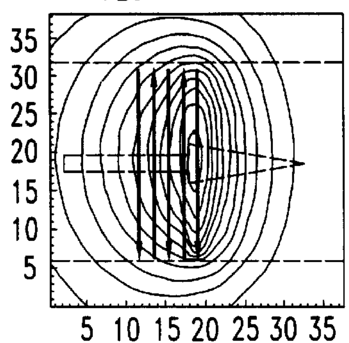

FIG. 7A illustrates the temperature distribution for a 1 cycle scan (a scan in which the segment is scanned one). The direction of the beam scan is illustrated by arrow 215. The direction of the stage scan is illustrated by arrow 720. After five scans, a hot spot 710 was observed at the location of the beam. FIG. 7B illustrates the temperature distribution in the resist and substrate that results when each segment is scanned four times instead of once. FIG. 7B demonstrates that the temperature distribution in the resist and substrate using 4-cycle scans is much more uniform than the temperature distribution using 1-cycle scans (FIG. 7A). FIG. 7C illustrates the temperature gradient in the resist material and substrate using 10-cycle scans. The use of 10-cycle scans provided even greater temperature uniformity than the use of 4-cycle scans.

The main writing strategy impact of performing multiple scans of a single segment is that basic bandwidth requirements go up a factor of 4 to 10, and any non-exposure event per mini-scan must be about the same factor shorter. Basic deflector settling and blanking events happen more often, but the strut-jumps are not more frequent. It is presently believed that the 4-cycle scan is easier to implement than the 10-cycle scan.

Finally, it is believed to be advantageous to skip rows in the sequencing of each chip-length segment. This tends to de-couple the worst case heating problem at the beginning of a new chip-length segment from the end of the last.

What is claimed is:

1. A lithographic process for device fabrication comprising:

scanning a beam of charged particle radiation over a pattern in a mask, wherein the pattern in the mask is divided into a plurality of segments, each segment having, in the direction of the scan, a first end and a second end and the segments are separated by non-patterned, regions;

transmitting an image of the pattern into an energy sensitive material by directing the beam of charged particle radiation transmitted through the mask onto an energy sensitive resist material;

blending the image of a first segment with the image of a second segment to form a continuous image in the energy sensitive resist material by providing duplicate pattern information at a first end of a first segment and a second end of a second segment, and overlapping the image of the duplicate pattern information from the first segment with the duplicate pattern information from the second segment;

and controlling the scan by turning on the beam of charged particle radiation, which has a cross sectional area that defines an optical field that, during the scan, has a leading edge and trailing edge, when the trailing edge of the charged particle beam approximately coincides with the first end of the segment and turning off the charged particle beam when the leading edge approximately coincides with the second end of the segment such that the overlapped image of the duplicate pattern information is introduced into the energy sensitive resist material with a dose of radiation that is approximately equal to the dose of radiation used to introduce into the energy sensitive resist material the image of the non-duplicate, non-overlapped pattern information in the segment.

2. The process of claim 1 wherein the segments are rectangular and wherein the width of the segment is within optical field during the scan and wherein the segment is scanned along its length.

3. The process of claim 2 further comprising blending the image of one segment with the image of another segment along the length of the images of the two segments to form a continuous image by providing pattern information along the length of one segment that duplicates pattern information along the length of another segment, wherein the image of the duplicate pattern information along the length of one segment is overlapped with the image of the duplicate pattern information along the length of the other segment.

4. The process of claim 3 further comprising projecting the charged particle beam through a shaped aperture and onto the mask, wherein the shaped aperture is such that the overlapped image of the duplicate pattern information is introduced into the energy sensitive resist material with a dose of radiation that is approximately equal to the dose of radiation used to introduce into the energy sensitive resist material the image of the non-duplicate, non-overlapped pattern information in the segment.

5. The process of claim 1 further comprising scanning a segment a plurality of times.

6. A lithographic process for device fabrication comprising:

scanning a beam of charged particle radiation over a pattern in a mask, wherein the pattern in the mask is divided into a plurality of segments, each segment having, in the direction of the scan, a first end and a second end and the segments are separated by non-patterned, support regions and wherein each segment is scanned a plurality of times; and transmitting an image of the pattern into an energy sensitive material by directing the beam of charged particle radiation transmitted through the mask onto an energy sensitive resist material.

7. The lithographic process of claim 6 further comprising:

blending the image of a first segment with the image of a second segment to form a continuous image in the energy sensitive resist material by providing duplicate pattern information at a first end of a first segment and a second end of a second segment, and overlapping the image of the duplicate pattern information from the first segment with the duplicate pattern information from the second segment;

and controlling the scan such that the overlapped image of the duplicate pattern information is introduced into the energy sensitive resist material with a dose of radiation that is approximately equal to the dose of radiation used to introduce into the energy sensitive resist material the image of the non-duplicate, non-overlapped pattern information in the segment.

8. The process of claim 7 wherein the scan is controlled by turning on the beam of charged particle radiation, which has a cross sectional area that defines an optical field that, during the scan, has a leading edge and trailing edge, when the trailing edge of the charged particle beam approximately coincides with the first end of the segment and turning off the charged particle beam when the leading edge approximately coincides with the second end of the segment.

9. The process of claim 8 wherein the segments are rectangular and wherein the width of the segment is within optical field during the scan and wherein the segment is scanned along its length.

10. The process of claim 9 further comprising blending the image of one segment with the image of another segment along the length of the images of the two segments to form a continuous image by providing pattern information along the length of one segment that duplicates pattern information along the length of another segment, wherein the image of the duplicate pattern information along the length of one segment is overlapped with the image of the duplicate pattern information along the length of the other segment.

11. The process of claim 10 further comprising projecting the charged particle beam through a shaped aperture and onto the mask, wherein the shaped aperture is such that the overlapped image of the duplicate pattern information is introduced into the energy sensitive resist material with a dose of radiation that is approximately equal to the dose of radiation used to introduce into the energy sensitive resist material the image of the non-duplicate, non-overlapped pattern information in the segment.

* * * * *